United States Patent
Bae et al.

(10) Patent No.: US 10,580,348 B2
(45) Date of Patent: Mar. 3, 2020

(54) DISPLAY DEVICE INCLUDING LIGHT-EMITTING DIODES

(71) Applicant: SAMSUNG DISPLAY CO., LTD., Yongin-si, Gyeonggi-Do (KR)

(72) Inventors: Jongsung Bae, Yongin-si (KR); Mugyeom Kim, Yongin-si (KR); Changyong Jeong, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 80 days.

(21) Appl. No.: 15/453,445

(22) Filed: Mar. 8, 2017

(65) Prior Publication Data

US 2017/0263178 A1 Sep. 14, 2017

(30) Foreign Application Priority Data

Mar. 10, 2016 (KR) ........................ 10-2016-0029109

(51) Int. Cl.
*G09G 3/32* (2016.01)
*H01L 27/12* (2006.01)
*H01L 27/15* (2006.01)

(52) U.S. Cl.
CPC ............. *G09G 3/32* (2013.01); *H01L 27/124* (2013.01); *H01L 27/153* (2013.01); *G09G 2300/0809* (2013.01)

(58) Field of Classification Search
CPC ...... G09G 3/32; G09G 3/3208; H01L 27/124; H01L 27/153

USPC .................................................. 345/76, 690
See application file for complete search history.

(56) References Cited

U.S. PATENT DOCUMENTS

| 8,791,931 B2 | 7/2014 | Takuma | |
| 9,047,818 B1* | 6/2015 | Day | G09G 3/3233 |
| 2013/0234590 A1* | 9/2013 | Li | H05B 33/24 |
| | | | 313/509 |
| 2014/0367711 A1 | 12/2014 | Bibl et al. | |
| 2017/0061903 A1* | 3/2017 | Yata | G09G 3/3413 |
| 2017/0141155 A1* | 5/2017 | Hughes | H01L 22/14 |

FOREIGN PATENT DOCUMENTS

| JP | 2011-221305 | 11/2011 |
| KR | 10-2006-0026243 | 3/2006 |
| KR | 10-2008-0002566 | 1/2008 |
| KR | 10-2008-0098245 | 11/2008 |
| KR | 10-2009-0022542 | 3/2009 |

* cited by examiner

*Primary Examiner* — Calvin C Ma

(74) *Attorney, Agent, or Firm* — F. Chau & Associates, LLC

(57) ABSTRACT

A display device includes pixels. Each of the plurality of pixels includes a pixel electrode, a light-emitting diode (LED), and an opposite electrode. The pixel electrode is divided into first to $n^{th}$ sub-electrodes. The LED is disposed on a boundary of the first to $n^{th}$ sub-electrodes. The opposite electrode is disposed opposite to the pixel electrode. The LED is disposed between the pixel electrode and the opposite electrode. n is an integer equal to or greater than 2.

20 Claims, 7 Drawing Sheets

DISPLAY DEVICE INCLUDING LIGHT-EMITTING DIODES

CROSS-REFERENCE TO RELATED APPLICATION

This application claims priority under 35 U.S.C. § 119 to Korean Patent Application No. 10-2016-0029109, filed on Mar. 10, 2016 in the Korean Intellectual Property Office, the disclosure of which is incorporated by reference herein in its entirety.

TECHNICAL FIELD

Exemplary embodiments of the present invention relate to a display device and, more particularly, to a display device including light-emitting diodes.

DISCUSSION OF RELATED ART

Light-emitting diodes (LEDs) use an electroluminescence phenomenon. An electroluminescence phenomenon is a phenomenon in which light is emitted from a material, such as a semiconductor due to an applied current or voltage. As electrons and holes combine in an active layer of the LEDs, energy corresponding to an energy band gap of the active layer may be emitted as light.

LEDs have been used for home appliances, remote controls, electric display boards, or automatic devices. LEDs are also applied in an increasing number of areas from small hand-held electronic devices to large display devices.

SUMMARY

One or more exemplary embodiments of the present invention include a structure for increasing gradation of a display device using light-emitting diodes (LEDs).

One or more exemplary embodiments of the present invention provide a display device. The display device includes a plurality of pixels. Each of the plurality of pixels includes a pixel electrode, a light-emitting diode (LED), and an opposite electrode. The pixel electrode is divided into first to $n^{th}$ sub-electrodes. The LED is disposed on a boundary of the first to $n^{th}$ sub-electrodes. The opposite electrode is disposed opposite to the pixel electrode. The LED is disposed between the pixel electrode and the opposite electrode. n is an integer equal to or greater than 2.

The first to $n^{th}$ sub-electrodes may be spaced apart from each other. The first to $n^{th}$ sub-electrodes may each have a crossing point.

The LED may be disposed on the crossing point.

The pixel electrode may be substantially parallel to the opposite electrode.

A gap between the pixel electrode and the opposite electrode may be substantially the same size as a height of the LED.

The first to $n^{th}$ sub-electrodes may be connected to first to $n^{th}$ thin film transistors (TFTs), respectively.

The LED may include a first contact electrode, a p-n diode, and a second contact electrode sequentially stacked. The first contact electrode may be connected to the pixel electrode. The second contact electrode may be connected to the opposite electrode.

The LED may include a light barrier disposed at a location corresponding to the boundary of the first to $n^{th}$ sub-electrodes.

The LED may be divided into first to $n^{th}$ sub-LEDs by the light barrier.

The light barrier may reflect light emitted from the LED.

The light barrier may be disposed at a location corresponding to the boundary between each of the first to $n^{th}$ sub-electrodes.

The display device may further include an optical waveguide layer. The optical waveguide layer may be disposed between the pixel electrode and the opposite electrode.

The display device may further include first to $n^{th}$ shutters. The first to $n^{th}$ shutters may be respectively disposed on the first to $n^{th}$ sub-electrodes. The first to $n^{th}$ shutters may be disposed to surround side surfaces of the LED.

The first to $n^{th}$ shutters may be configured to be driven by electrostatic force.

The first to $n^{th}$ shutters may include a black matrix material.

One or more exemplary embodiments of the present invention provide a display device. The display device includes a plurality of pixels. Each pixel comprises a pixel electrode, a light-emitting diode (LED), and an opposite electrode. The pixel electrode is divided into first to $n^{th}$ sub-electrodes. The light emitted diode (LED) is divided into first to $n^{th}$ sub-LEDs. The opposite electrode is disposed opposite to the pixel electrode. The first to $n^{th}$ sub-LEDs are disposed on a boundary of the first to $n^{th}$ sub-electrodes. n is an integer equal or greater than 2.

The first to $n^{th}$ sub-electrodes may be divided from each other from a crossing point the light-emitting diode is disposed on.

The pixel electrode may be a light reflective electrode.

The sub-LEDs may be electrically separated from each other by a light barrier.

One or more exemplary embodiments of the present invention provide a display device. The display device includes a plurality of pixels, a plurality of sub-pixels, a plurality of sub-pixel electrodes, and a plurality of light-emitting diodes (LEDs). The plurality of sub-pixels consist of each pixel. The plurality of sub-pixels are correspondingly disposed on the sub-pixels. The plurality of light-emitting diodes (LEDs) are separately controlled by the sub-pixel electrodes. Visible light generated by the light-emitting diodes (LED) propagates toward and fills in each sub-pixel area.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION OF THE EMBODIMENTS

Figure 1:
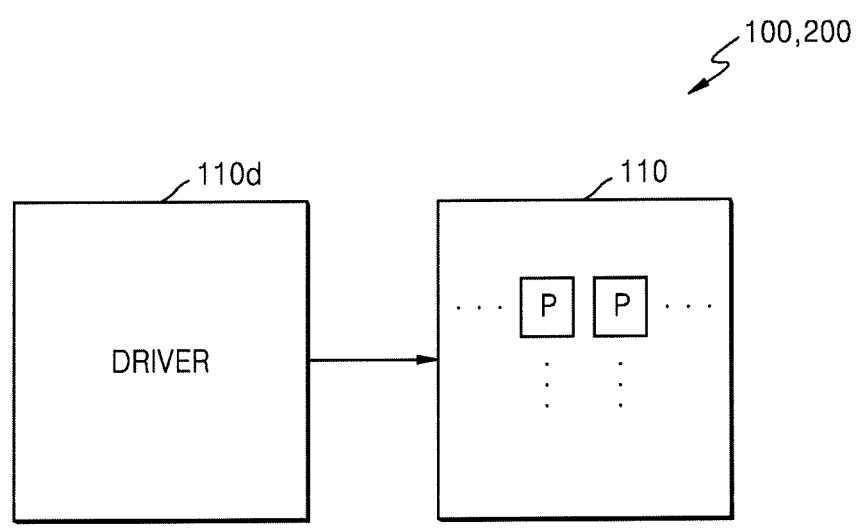
FIG. 1 is a conceptual view schematically illustrating display devices according to an exemplary embodiment of the present invention.

As the present invention allows for various changes and numerous embodiments, exemplary embodiments of the present invention will be illustrated in the drawings and described in detail herein. The accompanying drawings for illustrating exemplary embodiments of the present invention are referred to in order to gain an understanding of the present invention. The present invention may, however, be embodied in many different forms and should not be construed as being limited to the exemplary embodiments of the present invention set forth herein.

Like reference numerals in the drawings may denote like elements.

It will be understood that although the terms "first", "second", etc. may be used herein to describe various components, these components should not be limited by these terms. These components may only be used to distinguish one component from another.

Sizes of components in the drawings may be exaggerated for convenience of explanation.

FIG. 1 is a conceptual view schematically illustrating display devices according to an exemplary embodiment of the present invention.

Referring to FIG. 1, display devices 100 and 200 may each include a display 110 and a driver 110*d*. The display 110 may include pixels P. The pixels P may be arranged on a substrate, for example, in a matrix form. The driver 110*d* may include a scan driver. The scan driver may be configured to transmit scan signals to scan lines. The scan lines may be connected to the pixels P. The driver 110*d* may also include a data driver. The data driver may be configured to transmit data signals to data lines. The driver 110*d* may be disposed in a non-display area of the substrate. The non-display area of the substrate may be disposed around the display 110. The pixels P may be arranged on the display 110. The driver 110*d* may be an integrated circuit chip. The driver 110*d* may be mounted on the substrate including the display 110 or the driver 110*d* may be mounted on a flexible printed circuit film. Alternatively, the driver 110*d* may be a tape carrier package (TCP). Thus, the driver 110*d* may be attached to the substrate or formed on the substrate.

Figure 2:
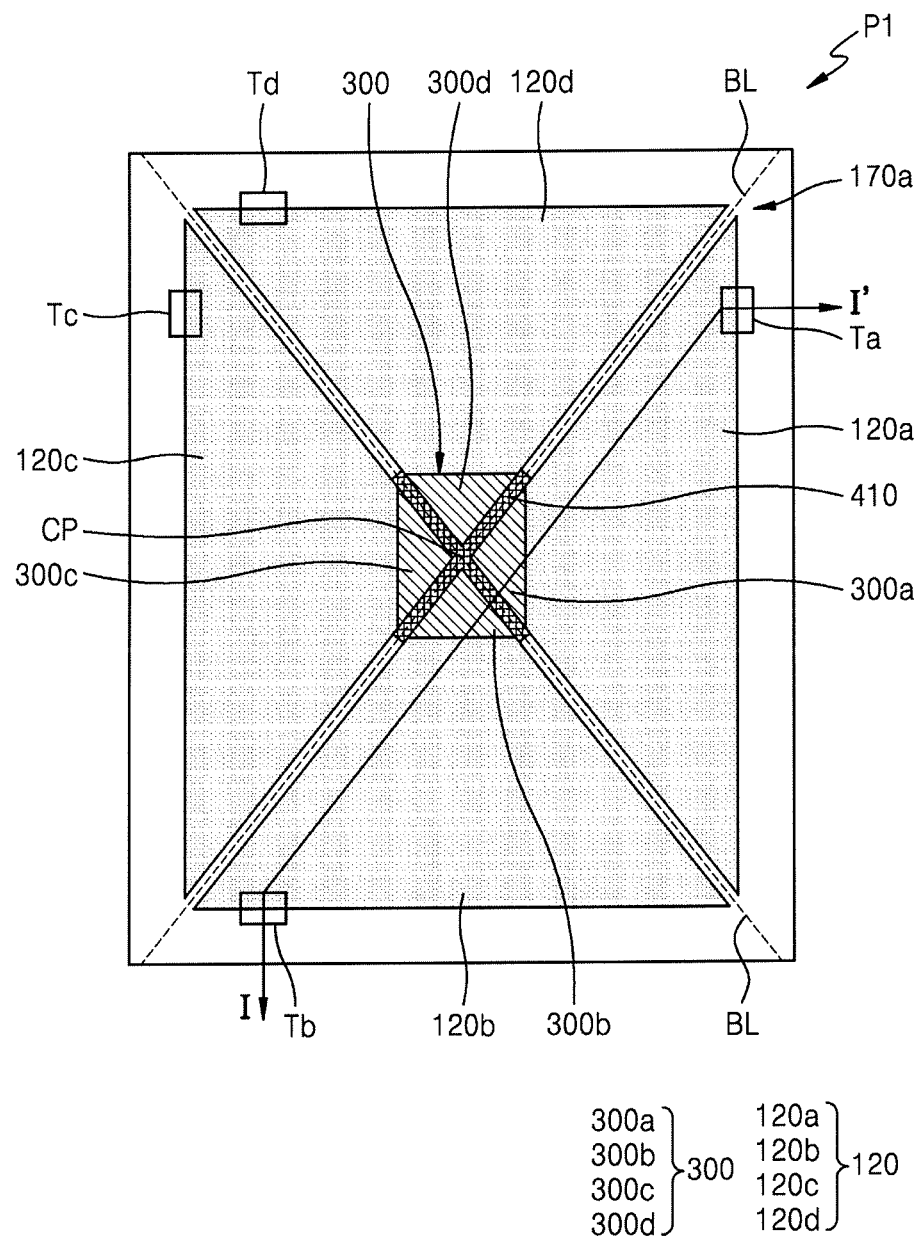
FIG. 2 is a plan view illustrating a pixel included in a display device according to an exemplary embodiment of the present invention.
Figure 3:
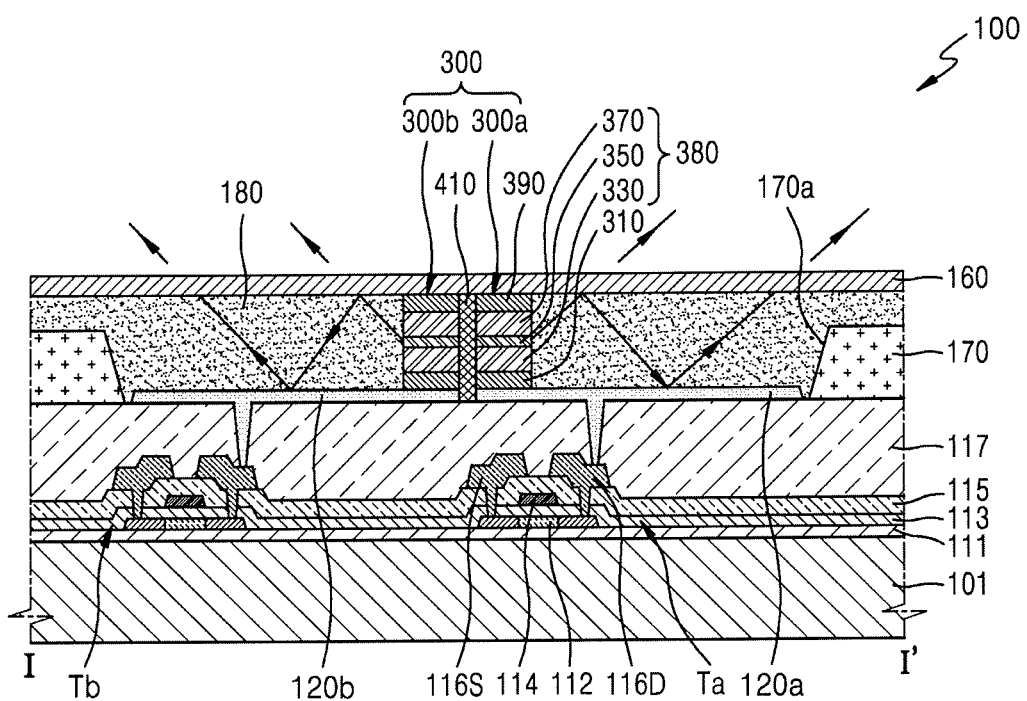
FIG. 3 is a cross-sectional view taken along a line I-I' of FIG. 2 according to an exemplary embodiment of the present invention.

FIG. 2 is a plan view illustrating a pixel included in a display device according to an exemplary embodiment of the present invention. FIG. 3 is a cross-sectional view taken along a line I-I' of FIG. 2 according to an exemplary embodiment of the present invention.

Referring to FIGS. 2 and 3, each pixel P1 may include a pixel electrode 120, a light-emitting diode (LED) 300, and an opposite electrode 160. The pixel electrode 120 may be divided into a first sub-electrode 120*a*, a second sub-electrode 120*b*, a third sub-electrode 120*c*, and a fourth sub-electrode 120*d*. The light-emitting diode (LED) 300 may be disposed on a crossing point of boundaries BL of the first sub-electrodes 120*a* to fourth sub-electrodes 120*d*. The opposite electrode 160 may be disposed on an opposite side of the light-emitting diode (LED) from the pixel electrode 120.

As illustrated in FIG. 2, the pixel P1 may be divided into four areas. However, exemplary embodiments of the present invention are not limited thereto. The pixel P1 may be divided into n areas. Here, n may be an integer equal to or greater than 2. The pixel P1 may include the pixel electrode 120, the LED 300, and the opposite electrode 160. The pixel P1 may be divided into first to $n^{th}$ sub-electrodes. The LED 300 may be disposed on the crossing point of boundaries BL of the first to $n^{th}$ sub-electrodes. The opposite electrode 160 may be disposed on an opposite side of the light-emitting diode (LED) from the pixel electrode 120.

The pixel electrode 120 may be divided into the first to $n^{th}$ sub-electrodes. Area or shape of the sub-electrodes may either be identical or different. The first to $n^{th}$ sub-electrodes may be divided from each other. The first to $n^{th}$ sub-electrodes may each have a crossing point CP where boundaries BL of the first sub-electrodes 120*a* to fourth sub-electrodes 120*d*. Referring to FIG. 2, the crossing point CP may be located at a center of the pixel electrode 120. However, exemplary embodiments of the present invention are not limited thereto. The crossing point CP may be at an edge of the pixel electrode 120. The first to $n^{th}$ sub-electrodes may be spaced apart from each other with respect to the boundaries BL. Accordingly, the first to $n^{th}$ sub-electrodes may be electrically separated from each other.

The LED 300 may be disposed on the crossing point CP. The LED 300 may be disposed at the center of the pixel P1. However, exemplary embodiments of the present invention are not limited thereto. The LED 300 may be disposed on a side surface of the pixel P1. An area of the pixel electrode 120 may be greater than an area of the LED 300. For example, the pixel electrode 120 may have an area that is about 2 times to about 30 times greater than an area of the LED 300.

The LED 300 may include light barriers 410. The light barriers 410 may be disposed at locations corresponding to the boundaries BL. The LED 300 may be divided into first to $n^{th}$ sub-LEDs by the light barriers 410. FIG. 2 illustrates that the LED 300 may be divided into a first sub-LED 300*a*, a second sub-LED 300*b*, a third sub-LED 300*c*, and a fourth sub-LED 300*d*. The light barriers 410 may be disposed between each of the first sub-LEDs 300*a* to fourth sub-LEDs 300*d*. The first sub-LEDs 300*a* to fourth sub-LEDs 300*d* may be electrically separated from each other by the light barriers 410.

The first to $n^{th}$ sub-electrodes of the pixel P1 may be connected to first to $n^{th}$ thin film transistors (TFTs), respectively. Referring to FIG. 2, the first to fourth sub-electrodes 120*a* to 120*d* may be connected to first TFTs Ta to fourth TFTs Td, respectively.

The pixel P1 may include the LED 300 and a pixel circuit. The pixel circuit may be connected to the LED 300. The pixel circuit may include a TFT in addition to the first to $n^{th}$ TFTs. The pixel circuit may also include at least one capacitor. The pixel electrode may be connected to at least one scan line and at least one data line. The at least one scan line and the at least one data line may drive the first to $n^{th}$ TFTs. The pixel P may be connected to scan lines and data lines according to the number of divided sub-electrodes.

The first to $n^{th}$ sub-LEDs may independently operate according to the driving of the first to $n^{th}$ TFTs. In order to adjust a light amount of the pixel P1, m TFTs, in which m is an integer equal to or greater than 1 and less than or equal to n, among the first to $n^{th}$ TFTs may be driven. Thus, light may be emitted from m sub-electrodes connected to the m TFTs. An amount of light may be relatively easily adjusted by dividing the pixel electrode 120. A gradation of the display device may be increased.

Referring to FIG. 3, some components included in the pixel P1 will be described in detail according to an order of stacking.

A buffer layer 111 may be disposed on a substrate 101. The first TFTs Ta and second TFTs Tb may be disposed on the buffer layer 111. The LED 300 may also be disposed on the buffer layer 111.

The substrate 101 may include glass or plastic. The buffer layer 111 may be configured to prevent penetration of impurities through the substrate 101. The buffer layer 111 may flatten a surface of the substrate 101. The buffer layer 111 may have a single layered structure or a multi-layered structure. The buffer layer 111 may include one or more inorganic materials such as silicon nitride (SiNx) and/or silicon oxide (SiOx).

The first TFT Ta may include an active layer 112, a gate electrode 114, a source electrode 116S, and a drain electrode 116D. The active layer 112 may include a semiconductor layer. The active layer 112 may have a source area, a drain area, and a channel area. The channel area may be disposed between the source area and the drain area. The source area, the drain area, and the channel area may each be conductive. The gate electrode 114 may be disposed over and insulated from the active layer 112. The source electrode 116S and the drain electrode 116D may be respectively electrically connected to the source area and the drain area of the active layer 112. At least one of the source electrode 116S and the drain electrode 116D may be omitted.

A first insulating layer 113 may be disposed between the active layer 112 and the gate electrode 114. The first insulating layer 113 may be a gate insulating layer. A second insulating layer 115 may be disposed between the gate electrode 114 and each of the source electrode 116S and the drain electrode 116D. The second insulating layer 115 may be an interlayer insulating layer. The first insulating layer 113 and the second insulating layer 115 may each have a single layered structure or a multi-layered structure. The first insulating layer 113 and the second insulating layer 115 may each include one or more inorganic materials such as $SiN_x$ and/or $SiO_x$.

A third insulating layer 117 may be disposed on the second insulating layer 115. The third insulating layer 117 may be a planarization layer. The third insulating layer 117 may be configured to cover the source electrode 116S and the drain electrode 116D. The third insulating layer 117 may include an organic material or an inorganic material. Alternatively, the third insulating layer 117 may include organic materials and inorganic materials.

FIG. 3 illustrates that the gate electrode 114 of the first TFT Ta may be disposed above the active layer 112. However, exemplary embodiments of the present invention are not limited thereto. The gate electrode 114 may be disposed below the active layer 112.

A bank 170 may be disposed on the third insulating layer 117. The bank 170 may define a pixel area. The bank 170 may include a concave portion 170a. The LED 300 may be disposed in the concave portion 170a. A height of the bank 170 may be determined based on a height of the LED 300 and a viewing angle. A size, for example, a width of the concave portion 170a may be determined based on a resolution of the display device 100 or pixel density. According to an exemplary embodiment of the present invention, the height of the bank 170 may be greater than the height of the LED 300. FIG. 2 illustrates that the concave portion 170a is quadrilateral. However, exemplary embodiments of the present invention are not limited thereto. For example, the concave portion 170a may be polygonal, rectangular, circular, oval, or triangular.

The pixel electrode 120 may be disposed on a lower surface of the concave portion 170a. According to some exemplary embodiments of the present invention, an edge or an end portion of the pixel electrode 120 may be covered by the bank 170. Alternatively, in some exemplary embodiments of the present invention, the pixel electrode 120 may extend towards a side surface of the concave portion 170a and/or an upper surface of the bank 170. The pixel electrode 120 may be divided into the first sub-electrode 120a and the second sub-electrode 120b. The first sub-electrode 120a and the second sub-electrode 120b may be electrically separated from each other. The light barrier 410 may be disposed between the first sub-electrode 120a and the second sub-electrode 120b.

The pixel electrode 120 may be a reflective electrode. The pixel electrode may include at least one layer. For example, the pixel electrode 120 may include a metal such as aluminum (Al), molybdenum (Mo), titanium (Ti), tungsten (W), silver (Ag), gold (Au), or an alloy thereof. The pixel electrode 120 may include a reflective layer and a transparent conductive layer. The transparent conductive layer may include a conductive material such as a transparent conductive oxide (TCO), for example, indium tin oxide (ITO), indium zinc oxide (IZO), zinc oxide (ZnO), or indium oxide ($In_2O_3$), a carbon nano tube film, or a transparent conductive polymer. According to an exemplary embodiment of the present invention, the pixel electrode 120 may have a tri-layer structure. The tri-layer structure may include a first transparent conductive layer, a second transparent conductive layer, and a reflective layer. The reflective layer may be disposed between the first transparent conductive layer and the second transparent conductive layer.

The first sub-electrode 120a and the second sub-electrode 120b may be connected to the first TFT Ta and the second TFT Tb, respectively. The first sub-electrode 120a may be electrically connected to the source electrode 116S or the drain electrode 116D of the first TFT Ta through a via hole formed in the third insulating layer 117. Referring to FIG. 3, the first sub-electrode 120a may be electrically connected to the drain electrode 116D. The second sub-electrode 120b may be electrically connected to a source electrode or a drain electrode of the second TFT Tb.

The bank 170 may be configured to provide as a light barrier having a relatively low light transmittance. The bank 170 may decrease or block light emitted towards a side surface of the LED 300. Thus, colors of light emitted from neighboring LEDs 300 may be prevented from being mixed with each other. The bank 170 may increase a contrast of the display device 100 by absorbing and blocking light incident from the outside. The bank 170 may include a material absorbing at least a portion of light, a light reflective material, or a light scattering material.

The LED 300 may be disposed in the concave portion 170a of the bank 170. The LED 300 may be a micro LED. The term 'micro' herein may indicate a size of about 1 μm to about 100 μm; however, exemplary embodiments of the present invention are not limited thereto. The LEDs 300 may be individually or collectively be picked up and transported on a wafer by a transport device to the substrate 101. Thus, the LEDs 300 may thereby be mounted in the concave portion 170a of the bank 170. According to an exemplary embodiment of the present invention, the LED 300 may be disposed in the concave portion 170a of the bank 170 after the bank 170 and the pixel electrode 120 are formed. The LED 300 may emit light having a certain wavelength included in a wavelength range from infrared rays to visible rays. For example, the LED 300 may be a red, green, blue, white, or ultraviolet (UV) LED.

The LED 300 may include a p-n diode 380, a first contact electrode 310, and a second contact electrode 390. The first contact electrode 310 and/or the second contact electrode 390 may include at least one layer. The first contact electrode 310 and/or the second contact electrode 390 may include various conductive materials. The conductive materials may include metals, conductive oxides, or conductive polymers. The first contact electrode 310 and the second contact electrode 390 may each include a reflective layer, for example, a silver layer. The first contact electrode 310 may be electrically connected to the pixel electrode 120. The second contact electrode 390 may be electrically connected to the opposite electrode 160. The p-n diode 380 may include a lower p-doping layer 330, at least one quantum well layer 350, and an upper n-doping layer 370. According to an exemplary embodiment of the present invention, an upper doping layer 370 may be a p-doping layer, and a lower doping layer 330 may be an n-doping layer. The p-n diode 380 may have a vertical side wall or a side wall that is tapered at a lower portion or upper portion thereof.

The LED 300 may include the first sub-LED 300*a*, the second sub-LED 300*b*, and the light barrier 410. The light barrier 410 may be disposed between the first sub-LED 300*a* and the second sub-LED 300*b*. The light barrier 410 may cover a side surface of each of the first sub-LED 300*a* and the second sub-LED 300*b*. The LED 300 may be divided into the first to n$^{th}$ sub-LEDs by the light barrier 410.

The first to n$^{th}$ sub-LEDs may be connected to the first to n$^{th}$ sub-electrodes, respectively. The first sub-LED 300*a* may be connected to the first sub-electrode 120*a*. The second sub-LED 300*b* may be connected to the second sub-electrode 120*b*.

The light barrier 410 may electrically separate the first to n$^{th}$ sub-LEDs from each other. The light barrier 410 may be a light blocking unit and/or a light reflector. The light barrier 410 may include insulating materials. The insulating materials may have a relatively low light transmittance. Therefore, the light barrier 410 may prevent light emitted from the first sub-LED 300*a* from entering into other areas except the first sub-electrode 120*a*. The light barrier 410 may include light reflective materials. Therefore, the light barrier 410 may change an optical path. Thus, the light emitted from the first sub-LED 300*a* may be reflected from the light barrier 410 and may propagate towards the first sub-electrode 120*a*.

The light barrier 410 may include thermoplastic resin, a thermosetting resin, or an organic insulating materials. The thermoplastic resin may include polycarbonate (PC), polyethylene terephthalate (PET), polyethersulfone, polyvinyl butyral, polyphenylene ether, polyamide, polyetherimide, norbornene-system resin, methacrylic resin or cyclic polyolefin. The thermosetting resin may include epoxy resin, phenol resin, urethane resin, acryl resin, vinyl ester resin, imide-based resin, urethane-based resin, urea resin, or melamine resin. The organic insulating material may include polystyrene, polyacrylonitrile, or polycarbonate. However, exemplary embodiments of the present invention are not limited thereto. The light barrier 410 may include an inorganic insulating material such as an inorganic oxide or an inorganic nitride, for example, SiOx, SiNx, SiNxOy, AlOx, TiOx, TaOx, or ZnOx. However, exemplary embodiments of the present invention are not limited thereto. According to an exemplary embodiment of the present invention, the light barrier 410 may include a translucent material such as an insulating black matrix material. The insulating black matrix material may be resin or paste including organic resin, glass paste, and a black pigment. The resin or paste may also include metal particles such as Ni, Al, Mo, or an alloy thereof, a metal oxide particle (e.g., a chromium oxide), or a metal nitride particle (e.g., a chromium nitride). The light barrier 410 may include a mirror reflector made of metallic wiring material such as Al, Mo, Ni, Fe, Co, Mn, and Cu.

In some exemplary embodiments of the present invention, the pixel electrode 120 and the LED 300 may be divided at substantially the same time. For example, electrode 120 and the LED 300 may be divided as they are cut by irradiation of laser beams along the boundaries BL. A groove may be formed in the LED 300 through laser cutting. The light barrier 410 may be disposed in the groove. However, exemplary embodiments of the present invention are not limited thereto. For example, after the pixel electrodes 120 are divided, the LED 300 may be divided.

The opposite electrode 160 may be a translucent electrode or a transparent electrode. For example, the opposite electrode 160 may include a conductive material such as a carbon nano tube film, a transparent conductive polymer, or a transparent conductive oxide (TCO) such as ITO, IZO, ZnO, or In$_2$O$_3$. The opposite electrode 160 may be a common electrode of the pixels P1. The opposite electrode 160 may be formed over the entire substrate 101.

The pixel electrode 120 and the opposite electrode 160 may face each other. The LED 300 may be disposed between the pixel electrode 120 and the opposite electrode 160. Light emitted from the LED 300 may be reflected from between the pixel electrode 120 and the opposite electrode 160, may propagate towards the side surfaces of the opposite electrode 160. Thus, the light may be emitted to the outside through the opposite electrode 160. In some exemplary embodiments of the present invention, the pixel electrode 120 and the opposite electrode 160 may be substantially parallel to each other. Accordingly, the light may easily propagate towards the side surfaces of the opposite electrode 160. In some exemplary embodiments of the present invention, a gap between the pixel electrode 120 and the opposite electrode 160 may be substantially the same as the height of the LED 300.

An optical waveguide layer 180 may be disposed between the pixel electrode 120 and the opposite electrode 160. The optical waveguide layer 180 may include a transparent material having a certain refractive index to allow the light to propagate towards the side surfaces of the opposite electrode 160. For example, the optical waveguide layer 180 may include a material having a refractive index ranging from about 1.2 to about 1.7. The optical waveguide layer 180 may surround the LED 300 in the concave portion 170*a*. The optical waveguide layer 180 may cover the bank 170. The optical waveguide layer 180 might not cover an upper portion of the LED 300, for example, the second contact electrode 390. Thus, the second contact electrode 390 may be exposed.

In some exemplary embodiments of the present invention, the optical waveguide layer 180 may include acryl, polymethyl methacrylate (PMMA), benzocyclobutene (BCB), polyimide, acrylate, epoxy, or polyester. However, exemplary embodiments of the present invention are not limited thereto. The opposite electrode 160 may be electrically connected to the exposed second contact electrode 390 of the LED 300. The opposite electrode 160 may be formed on an upper surface of the optical waveguide layer 180.

According to an exemplary embodiment of the present invention, it has the pixel electrode 120 may be a reflective electrode. The opposite electrode 160 may be a transparent electrode or a translucent electrode. However, exemplary embodiments of the present invention are not limited thereto. For example, the pixel electrode 120 may be a transparent electrode or a translucent electrode. The opposite electrode 160 may be a reflective electrode. Thus, light may be emitted towards the substrate 101.

Figure 4:
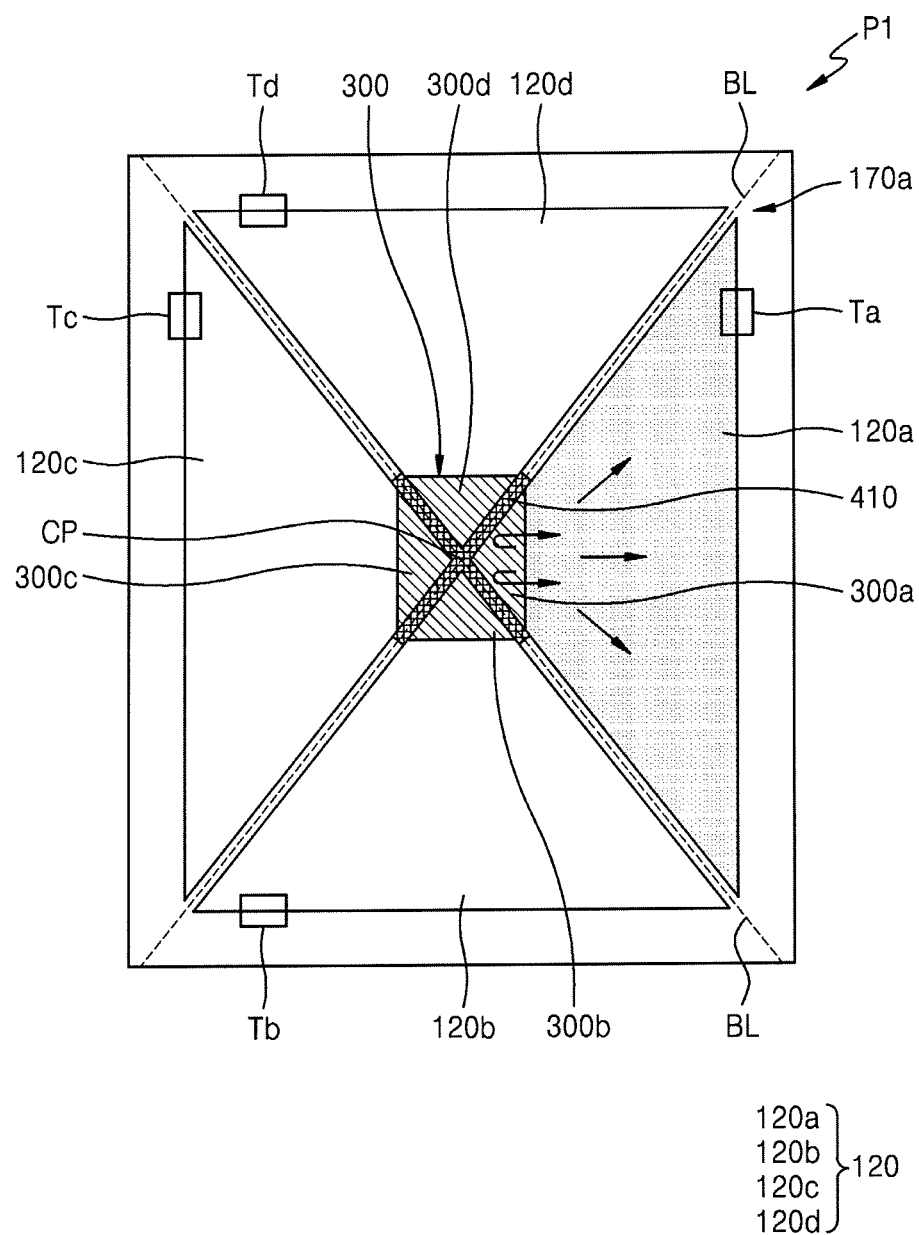
FIG. 4 is a plan view illustrating light extraction from a pixel according to an exemplary embodiment of the present invention.

FIG. 4 is a plan view illustrating light extraction from a pixel according to an exemplary embodiment of the present invention.

Referring to FIG. 4, an area of the pixel electrode 120 corresponding to the first sub-electrode 120a may be lit. When the first TFT Ta is turned on, a voltage may be applied to the first sub-electrode 120a. As the voltage is applied to the first sub-electrode 120a, light may be emitted from a side surface of the first LED 300a connected to the first sub-electrode 120a. The emitted light may be reflected from between the first sub-electrode 120a and the opposite electrode 160 of FIG. 3 and propagates. Thus, the emitted light may be extracted upwards through the opposite electrode 160.

The light barrier 410 may block the light emitted from the first LED 300a. Alternatively, the light barrier 410 may reflect the light emitted from the first LED 300a towards adjacent sub-electrodes, and the reflected light may propagate to the first sub-electrode 120a.

A display device according to an exemplary embodiment of the present invention may include a pixel electrode divided into sub-electrodes such that a light amount of each pixel may be adjusted relatively easily.

Figure 5:
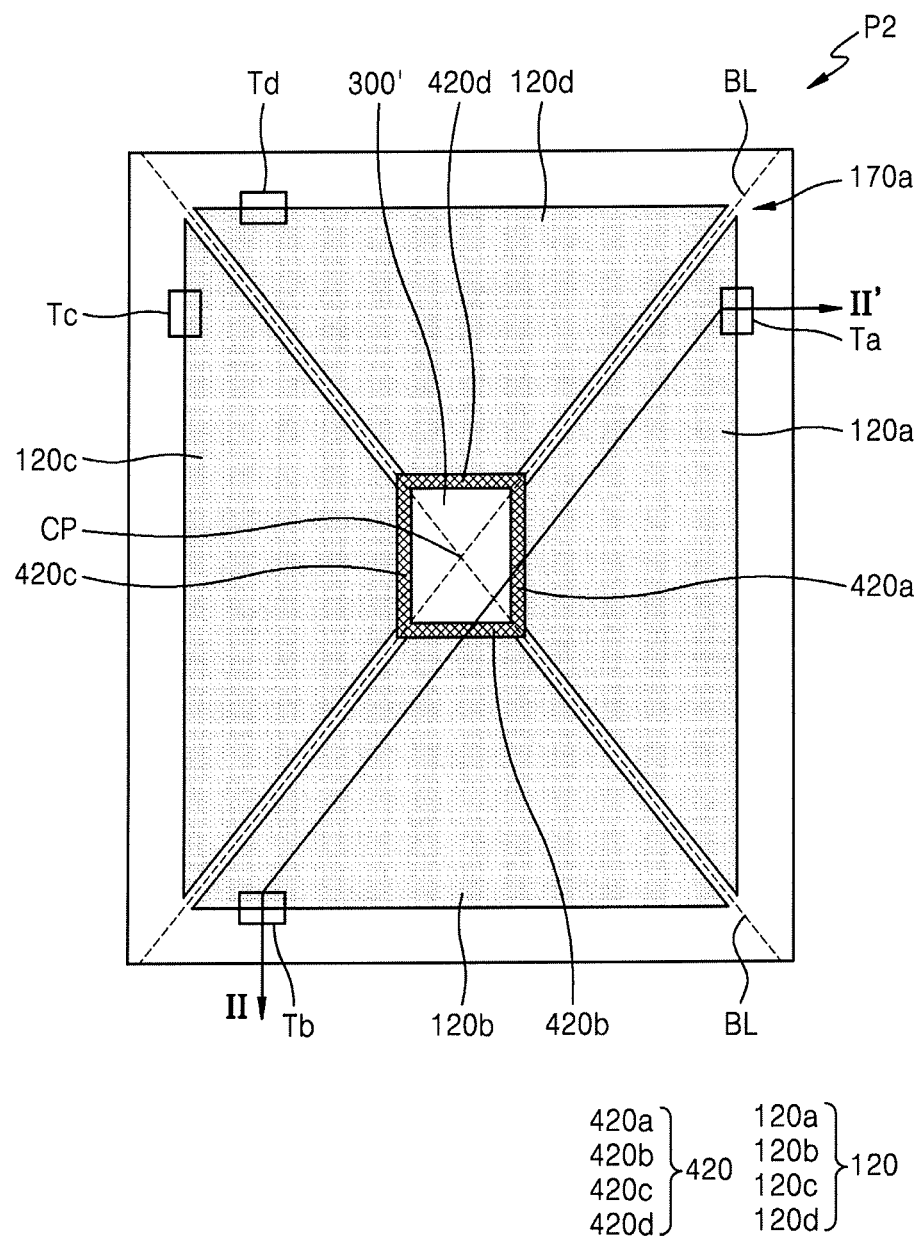
FIG. 5 is a plan view illustrating a pixel included in a display device according to an exemplary embodiment of the present invention.
Figure 6:
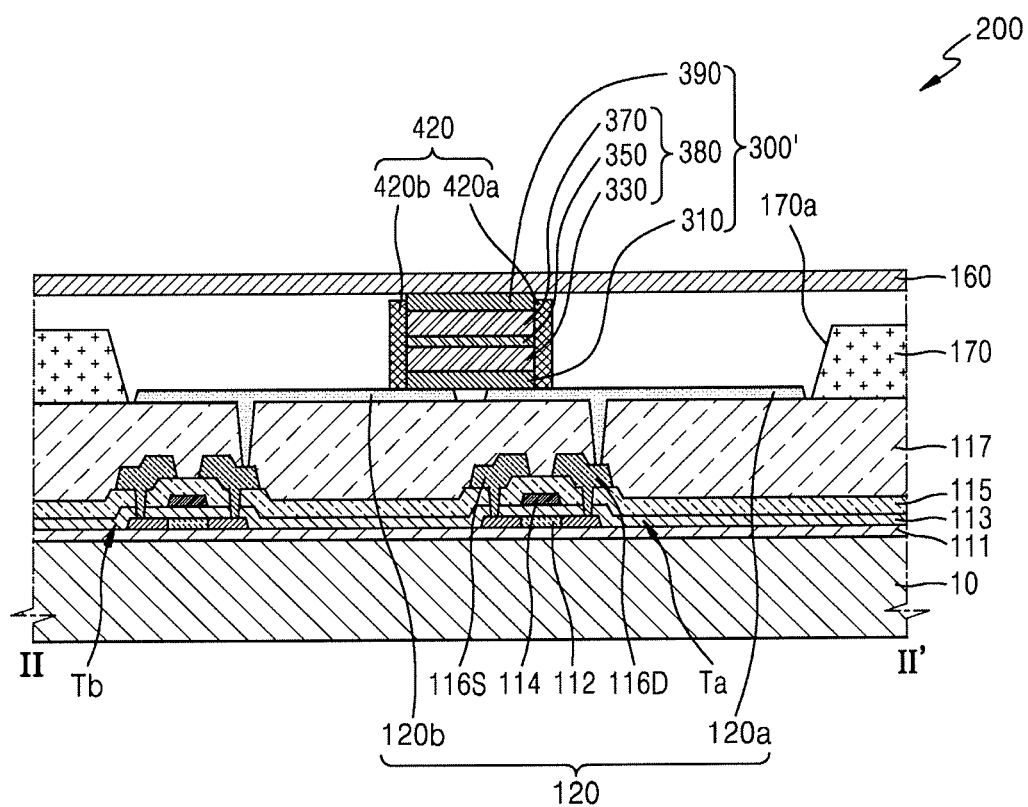
FIG. 6 is a cross-sectional view taken along a line II-II' of FIG. 5 according to an exemplary embodiment of the present invention.

FIG. 5 is a plan view illustrating a pixel included in a display device according to an exemplary embodiment of the present invention. FIG. 6 is a cross-sectional view taken along a line II-II' of FIG. 5 according to an exemplary embodiment of the present invention.

Referring to FIGS. 5 and 6, each pixel P2 may include the pixel electrode 120, an LED 300', the opposite electrode 160. The pixel electrode 120 may be divided into the first to fourth sub-electrodes 120a to 120d. The LED 300' may be disposed on the cross point of the boundaries BL of the first sub-electrodes 120a to fourth sub-electrodes 120d. The opposite electrode 160 may be disposed on an opposite of light-emitting diode (LED) from the pixel electrode 120.

FIG. 5 illustrates that the pixel P2 may be divided into four areas. However, exemplary embodiments of the present invention are not limited thereto. The pixel P2 may be divided into n number of areas, in which, n is an integer equal to or greater than 2. The pixel P2 may include the pixel electrode 120 divided into the first to $n^{th}$ sub-electrodes, the LED 300' disposed on the crossing point of boundaries BL of the first to $n^{th}$ sub-electrodes, and the opposite electrode 160 disposed opposite to the pixel electrode 120 with the LED 300' disposed therebetween.

Area or shape of sub-electrodes may either identical or different from each other. The first to $n^{th}$ sub-electrodes may be divided having the crossing point CP. FIG. 5 illustrates the crossing point CP at the center of the pixel electrode 120. However, exemplary embodiments of the present invention are not limited thereto. The crossing point CP may be close to an edge of the pixel electrode 120. The first to $n^{th}$ sub-electrodes may be apart from each other with respect to the boundaries BL. Accordingly, the first to $n^{th}$ sub-electrodes may be electrically separated from each other.

The LED 300' may be disposed on the crossing point CP. The LED 300' may be disposed at the center of the pixel P2. However, exemplary embodiments of the present invention are not limited thereto. The LED 300' may be disposed on a side surface of the pixel P2. An area of the pixel electrode 120 may be greater than an area of the LED 300'. For example, the pixel electrode 120 may have an area that is about 2 times to about 30 times the area of the LED 300'.

The LED 300' may be a microLED. The term 'micro' herein may indicate a size of LED is ranged from about 1 μm to about 100 μm; however, exemplary embodiments of the present invention are not limited thereto. The micro-LED may be a single unit of device fabricated on a wafer through epitaxial thin-film deposition technology. On the other hand, the micro-LED may be a unit of hundreds or thousands of nano-sized LED. The LEDs 300' may be individually or collectively picked up and transported from a wafer by a transport apparatus to the substrate 101. Thus, the LEDs 300' may thereby mounted in the concave portion 170a of the substrate 101. According to an exemplary embodiment of the present invention, the LED 300' may be mounted in the concave portion 170a of the substrate 101 after the bank 170 and the pixel electrode 120 are formed. The LED 300' may emit light having a certain wavelength included in a wavelength range from infrared rays to visible rays. For example, the LED 300' may be a red, green, blue, white, or UV LED.

The LED 300' may include the p-n diode 380, the first contact electrode 310, and the second contact electrode 390. The first contact electrode 310 and/or the second contact electrode 390 may include at least one layer. The first contact electrode 310 and/or the second contact electrode 390 may include various conductive materials. The conductive materials may include metals, conductive oxides, or conductive polymers. The first contact electrode 310 and the second contact electrode 390 may each include a reflective layer, for example, a silver layer. The first contact electrode 310 may be electrically connected to the pixel electrode 120. The second contact electrode 390 may be electrically connected to the opposite electrode 160. The p-n diode 380 may include a lower p-doping layer 330, at least one quantum well layer 350, and an upper n-doping layer 370. According to an exemplary embodiment of the present invention, the upper doping layer 370 may be a p-doping layer. The lower doping layer 330 may be an n-doping layer. The p-n diode 380 may include a vertical side wall or a side wall that is tapered at an upper portion or a lower portion thereof.

The first contact electrode 310 of the LED 300' may be connected to the first to $n^{th}$ sub-electrodes. That is, the first contact electrode 310 may be connected to the first sub-electrode 120a and the second sub-electrode 120b.

Shutters 420 may surround the side surfaces of the LED 300'. The shutters 420 may be comprised of n numbers of shutters. The first to $n^{th}$ shutters may respectively be formed on the first to $n^{th}$ sub-electrodes respectively. Referring to FIG. 5, first shutter 420a to fourth shutters 420d may respectively be disposed on the first sub-electrode 120a to fourth sub-electrode 120d.

The shutters 420 may be comprised of a light barrier and/or a light reflector. The shutters 420 may be formed of insulating materials having a relatively low light transmittance. The shutters 420 may include optically reflective materials. The shutters 420 may be turned ON/OFF by using electrostatic force between shutters and sub-electrodes. When the shutters 420 are off, the shutters 420 may cover the side surfaces of the LED 300' as it is formed. Thus, the shutters 420 may block and/or reflect light emitted from the LED 300'. When the shutters 420 are on, the side surfaces of the LED 300' may be exposed. Thus, light may be emitted to the outside.

In some exemplary embodiments of the present invention, the shutters 420 may include thin insulating layers. Thus, upper portions of the shutters 420 may move towards the pixel electrode 120 by attractive force due to a voltage applied to the pixel electrode 120 and a potential difference of the shutters 420. However, exemplary embodiments of the present invention are not limited thereto. The shutters 420 may have various microelectromechanical system (MEMS) structures.

The shutters 420 may include a thermoplastic resin, a thermosetting resin, or an organic insulating material. The thermosetting resin may include PC, PET, polyethersulfone, polyvinyl butyral, polyphenylene ether, polyamide, polyetherimide, norbornene-system resin, methacrylic resin, or cyclic polyolefin. The thermosetting resin may include epoxy resin, phenol resin, urethane resin, acryl resin, vinyl ester resin, imide-based resin, urethane-based resin, urea resin, or melamine resin. Thus organic insulating material may include polystyrene, polyacrylonitrile, or polycarbonate. However, exemplary embodiments of the present invention are not limited thereto. The shutter 420 may include an inorganic insulating material such as an inorganic oxide or an inorganic nitride, for example, SiOx, SiNx, SiNxOy, AlOx, TiOx, TaOx, or ZnOx. However, exemplary embodiments of the present invention are not limited thereto.

In some exemplary embodiments of the present invention, the shutter 420 may include a translucent material such as an insulating black matrix material. The insulating black matrix material may be, for example, resin or paste such as organic resin, glass paste, and a black pigment, metal particles such as Ni, Al, Mo, and an alloy thereof, a metal oxide particle (e.g., a chromium oxide), or a metal nitride particle (e.g., a chromium nitride). Alternatively, the shutter 420 may include a mirror reflector either made of metallic wiring material such as Al, Mo, Ni, Fe, Co, Mn, and Cu or made of insulating material coated on surface with the metallic wiring material The first to $n^{th}$ sub-electrodes of the pixel P2 may be respectively connected to the first to $n^{th}$ TFTs. Referring to FIG. 5, the first to fourth sub-electrodes 120a to 120d may be respectively connected to the first TFTs Ta to fourth TFTs Td.

The pixel P2 may include the LED 300' and a pixel circuit. The pixel circuit may be connected to the pixel P2. The pixel circuit may further include a TFT in addition to the first to $n^{th}$ TFTs and at least one capacitor. The pixel circuit may be connected to at least one scan line and at least one data line. The at least one scan line and the at least one data line may drive the first to $n^{th}$ TFTs. The pixel P2 may be connected to scan lines and data lines according to the number of divided sub-electrodes.

The first to $n^{th}$ sub-LEDs may be respectively driven according to the driving of the first to $n^{th}$ TFTs. In order to adjust a light amount of the pixel P2, m TFTs, in which m is equal to greater than 1 and less than or equal to n, among the first to $n^{th}$ TFTs are driven. Light may be emitted from m sub-electrodes connected to the m TFTs. The light amount may be relatively easily adjusted. The gradation of a display device may be increased by dividing the pixel electrode 120.

Figure 7:
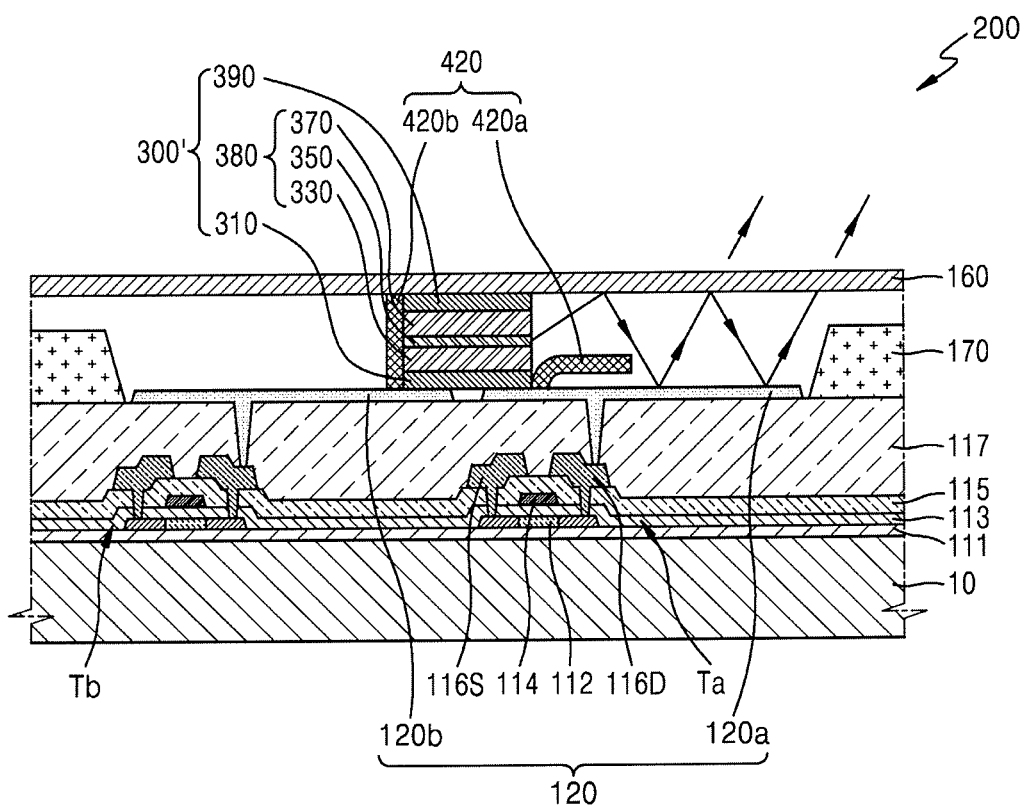
FIG. 7 is a plan view illustrating light extraction from a pixel according to an exemplary embodiment of the present invention.

FIG. 7 is a plan view illustrating light extraction from a pixel according to an exemplary embodiment of the present invention.

FIG. 7 illustrates that a side surface of the LED 300' may be open as the first shutter 420a is turned on. The first shutter 420a may be turned on in synchronization with the first TFT Ta. As the first shutter 420a is on, light emitted from the LED 300' may be reflected and propagates between the first sub-electrode 120a and the opposite electrode 160. Thus, the light may be extracted upwards through the opposite electrode 160.

The second shutter 420b may block the light emitted from the LED 300'. Alternatively, the second shutter 420b may reflect the light to other sub-electrodes. The reflected light may propagate to the first sub-electrode 120a.

The display device 200 according to an exemplary embodiment of the present invention may include the pixel electrode divided into sub-electrodes such that a light amount of each pixel may be relatively easily adjusted.

According to the one or more exemplary embodiments of the present invention, a pixel electrode may be divided to partially extract light emitted from LEDs in one pixel. Thus a gradation of a display device using the LEDs may be increased.

It should be understood that exemplary embodiments of the present invention described herein should be considered in a descriptive sense only and not for purposes of limitation. Descriptions of features or aspects within each exemplary embodiment of the present invention should be considered as available for other similar features or aspects in other exemplary embodiments of the present invention.

While one or more exemplary embodiments of the present invention have been described with reference to the figures, it will be understood by those of ordinary skill in the art that various changes in form and details may be made therein without departing from the spirit and scope of the present invention.

What is claimed is:

1. A display device, comprising:
   a plurality of pixels,
   wherein each of the plurality of pixels comprises:
   a pixel electrode divided into first to $n^{th}$ sub-electrodes;
   a light-emitting diode (LED) disposed on a boundary of the first to $n^{th}$ sub-electrodes, wherein the LED is disposed on a portion of each of the first to $n^{th}$ sub-electrodes;
   first to $n^{th}$ shutters, wherein each of the first to $n^{th}$ shutters is disposed on a side surface of the LED to surround the LED; and
   an opposite electrode disposed opposite to the pixel electrode, wherein
   the LED is disposed between the pixel electrode and the opposite electrode, and
   wherein n is an integer equal to or greater than 2.

2. The display device of claim 1, wherein the first to $n^{th}$ sub-electrodes are spaced apart from each other and each have a crossing point.

3. The display device of claim 2, wherein the LED) is disposed on the crossing point.

4. The display device of claim 1, wherein the pixel electrode is substantially parallel to the opposite electrode.

5. The display device of claim 1, wherein a gap between the pixel electrode and the opposite electrode is substantially the same size as a height of the LED.

6. The display device of claim 1, wherein the first to $n^{th}$ sub-electrodes are connected to first to $n^{th}$ thin film transistors (TFTs), respectively.

7. The display device of claim 1, wherein, the LED comprises a first contact electrode, a p-n diode, and a second contact electrode sequentially stacked,
   the first contact electrode is connected to the pixel electrode, and
   the second contact electrode is connected to the opposite electrode.

8. The display device of claim 1, wherein the first to $n^{th}$ shutters are respectively disposed on the first to $n^{th}$ sub-electrodes.

9. The display device of claim 8, wherein the first to $n^{th}$ shutters are configured to be driven by electrostatic force.

10. The display device of claim 8, wherein the first to $n^{th}$ shutters comprise a black matrix material.

11. A display device, comprising:
a plurality of pixels,
wherein each of the plurality of pixels comprises:
a pixel electrode divided into first to $n^{th}$ sub-electrodes;
a light-emitting diode (LED) disposed on a boundary of the first to $n^{th}$ sub-electrodes; and
an opposite electrode disposed opposite to the pixel electrode, wherein
the LED is disposed between the pixel electrode and the opposite electrode, and wherein n is an integer equal to or greater than 2, wherein the LED comprises a light barrier disposed at a location corresponding to the boundary of the first to $n^{th}$ sub-electrodes, wherein the light barrier divides the LED into first to $n^{th}$ sub-LEDs and is configured to block light where the LED is divided.

12. The display device of claim 11, wherein the light barrier reflects light emitted from the LED.

13. The display device of claim 11, wherein the light barrier is disposed at a location corresponding to the boundary between each of the first to $n^{th}$ sub-electrodes.

14. The display device of claim 11, further comprising an optical waveguide layer disposed between the pixel electrode and the opposite electrode.

15. The display device of claim 11, wherein the light barrier extends between the first to $n^{th}$ sub-LEDs and is disposed on a same layer as the first to $n^{th}$ sub-electrodes.

16. A display device, comprising:
a plurality of pixels,
wherein each of the plurality of pixels comprises:
a pixel electrode divided into first to $n^{th}$ sub-electrodes;
a light-emitting diode (LED) divided into first to $n^{th}$ sub-LEDs; and
an opposite electrode disposed opposite to the pixel electrode, wherein
the first to $n^{th}$ sub-LEDs are disposed on a boundary of the first to $n^{th}$ sub-electrodes, and
wherein n is an integer equal to or greater than 2, wherein the LED comprises a light barrier configured to divide the LED into the first to $n^{th}$ sub-LEDs and is configured to block light where the LED is divided.

17. The display device of claim 16, wherein the first to $n^{th}$ sub-electrodes are divided from each other from a crossing point the light-emitting diode (LED) is disposed on.

18. The display device of claim 16, wherein the pixel electrode is a light reflective electrode.

19. The display device of claim 16, wherein the sub-LEDs are electrically separated from each other by the light barrier.

20. A display device, comprising:
a plurality of pixels;
a plurality of sub-pixels in each pixel;
a plurality of sub-pixel electrodes disposed on the sub-pixels correspondingly; and
a light-emitting diode (LED) including a plurality of sub-LEDs, wherein each sub-LED of the plurality of sub-LEDs is separately controlled by a corresponding sub-pixel electrode of the plurality of sub-pixel electrodes, wherein a light barrier is disposed on a side surface of each sub-LED of the plurality of sub-LEDs, wherein the light barrier is substantially perpendicular to a sub-pixel electrode of the plurality of sub-pixel electrodes, and
wherein visible light generated by the light-emitting diode (LED) propagates toward and filled in each sub-pixel area.

* * * * *